United States Patent
Ikeda et al.

(10) Patent No.: US 7,790,626 B2
(45) Date of Patent: Sep. 7, 2010

(54) PLASMA SPUTTERING FILM DEPOSITION METHOD AND EQUIPMENT

(75) Inventors: Taro Ikeda, Nirasaki (JP); Kenji Suzuki, Albany, NY (US); Tatsuo Hatano, Nirasaki (JP); Yasushi Mizusawa, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 405 days.

(21) Appl. No.: 11/577,505

(22) PCT Filed: Oct. 18, 2005

(86) PCT No.: PCT/JP2005/019124

§ 371 (c)(1),
(2), (4) Date: Aug. 7, 2007

(87) PCT Pub. No.: WO2006/043554

PCT Pub. Date: Apr. 27, 2006

(65) Prior Publication Data

US 2008/0038919 A1    Feb. 14, 2008

(30) Foreign Application Priority Data

Oct. 19, 2004    (JP) ............................. 2004-304921

(51) Int. Cl.
    H01L 21/00    (2006.01)
(52) U.S. Cl. ...................... 438/758; 438/624; 438/694; 438/782; 438/787; 257/E21.279; 257/E21.546
(58) Field of Classification Search ................ 438/424, 438/427, 435, 437, 687, 720, 722, 765, 778, 438/788, 790; 257/E21.169, 252, 277, 477, 257/478, 547, 577, 582, 585, E23.145
See application file for complete search history.

(56) References Cited

U.S. PATENT DOCUMENTS

| | | | | |
|---|---|---|---|---|
| 5,888,414 A | * | 3/1999 | Collins et al. ................. | 216/68 |
| 6,030,881 A | * | 2/2000 | Papasouliotis et al. ...... | 438/424 |
| 6,200,911 B1 | * | 3/2001 | Narwankar et al. ......... | 438/758 |
| 6,245,641 B1 | * | 6/2001 | Shiozawa et al. ........... | 438/427 |
| 6,331,494 B1 | * | 12/2001 | Olson et al. ................. | 438/770 |
| 6,451,177 B1 | * | 9/2002 | Gopalraja et al. ...... | 204/192.12 |

(Continued)

FOREIGN PATENT DOCUMENTS

JP    3 28370    2/1991

(Continued)

*Primary Examiner*—Michael S Lebentritt
(74) *Attorney, Agent, or Firm*—Oblon, Spivak, McClelland, Maier & Neustadt, L.L.P.

(57) ABSTRACT

The present invention relates to a technology for depositing a thin metal film by using a plasma sputtering technique on a top surface of a target object, e.g., a semiconductor wafer or the like, and on a surface of a recess opened at the top surface. The film deposition method is characterized in that a film deposition process to deposit a metal film on a sidewall of the recess by generating metal ions by way of making a metal target sputter with a plasma generated from a discharge gas in the processing container and by applying to the mounting table a bias power to cause a metal film deposition based on a metal ion attraction and a sputter etching based on the plasma generated from the discharge gas simultaneously on the top surface of the target object.

10 Claims, 7 Drawing Sheets

U.S. PATENT DOCUMENTS

| | | | |
|---|---|---|---|
| 6,559,061 B2 * | 5/2003 | Hashim et al. | 438/722 |
| 6,660,622 B2 * | 12/2003 | Chen et al. | 438/595 |
| 6,794,290 B1 * | 9/2004 | Papasouliotis et al. | 438/694 |
| 6,884,329 B2 * | 4/2005 | Wang et al. | 204/192.3 |
| 7,041,201 B2 * | 5/2006 | Gung et al. | 204/192.12 |
| 7,294,574 B2 * | 11/2007 | Ding et al. | 438/687 |

FOREIGN PATENT DOCUMENTS

| | | |
|---|---|---|
| JP | 4 14831 | 1/1992 |
| JP | 2001 223181 | 8/2001 |
| JP | 2004 253781 | 9/2004 |

\* cited by examiner

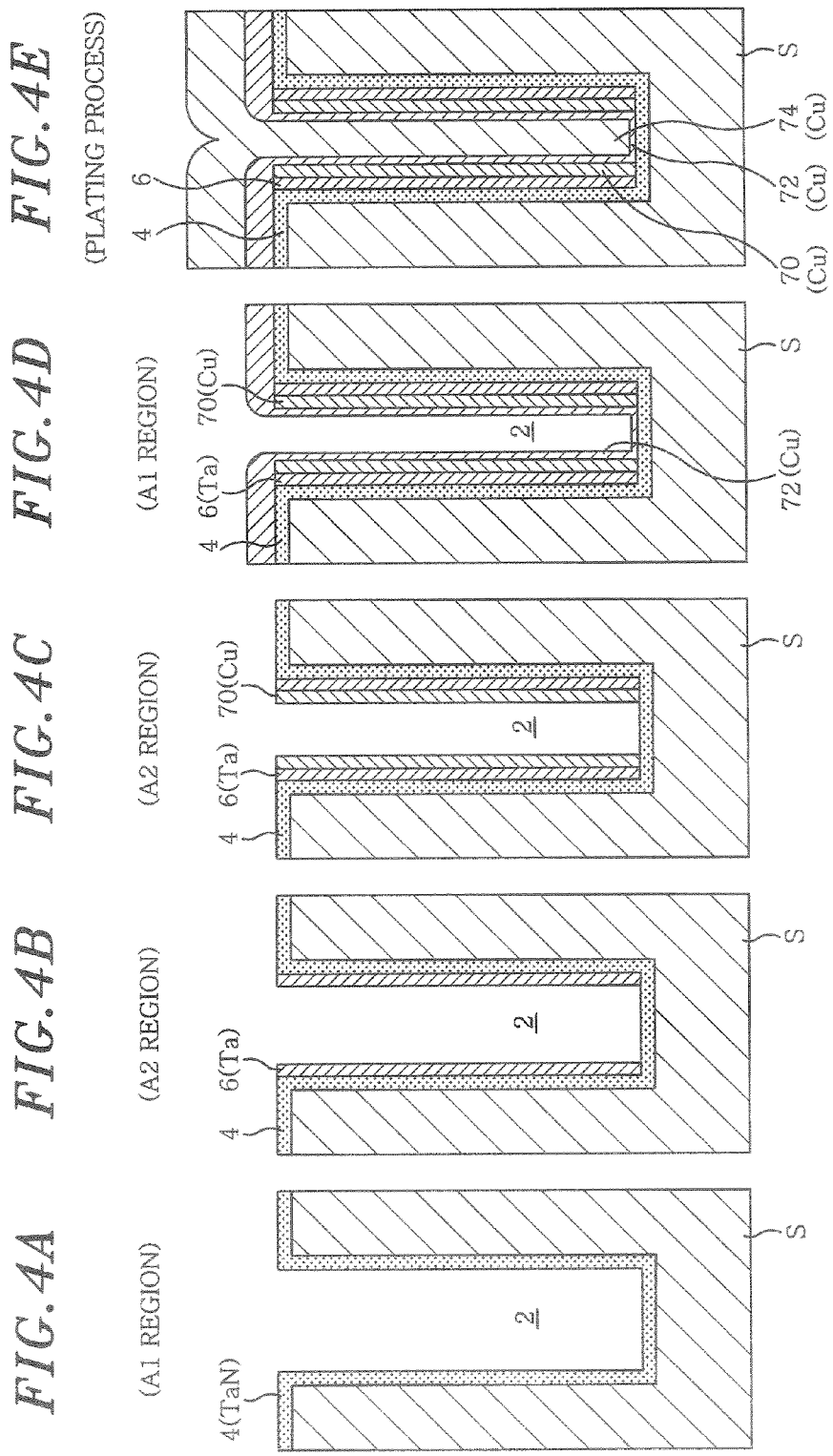

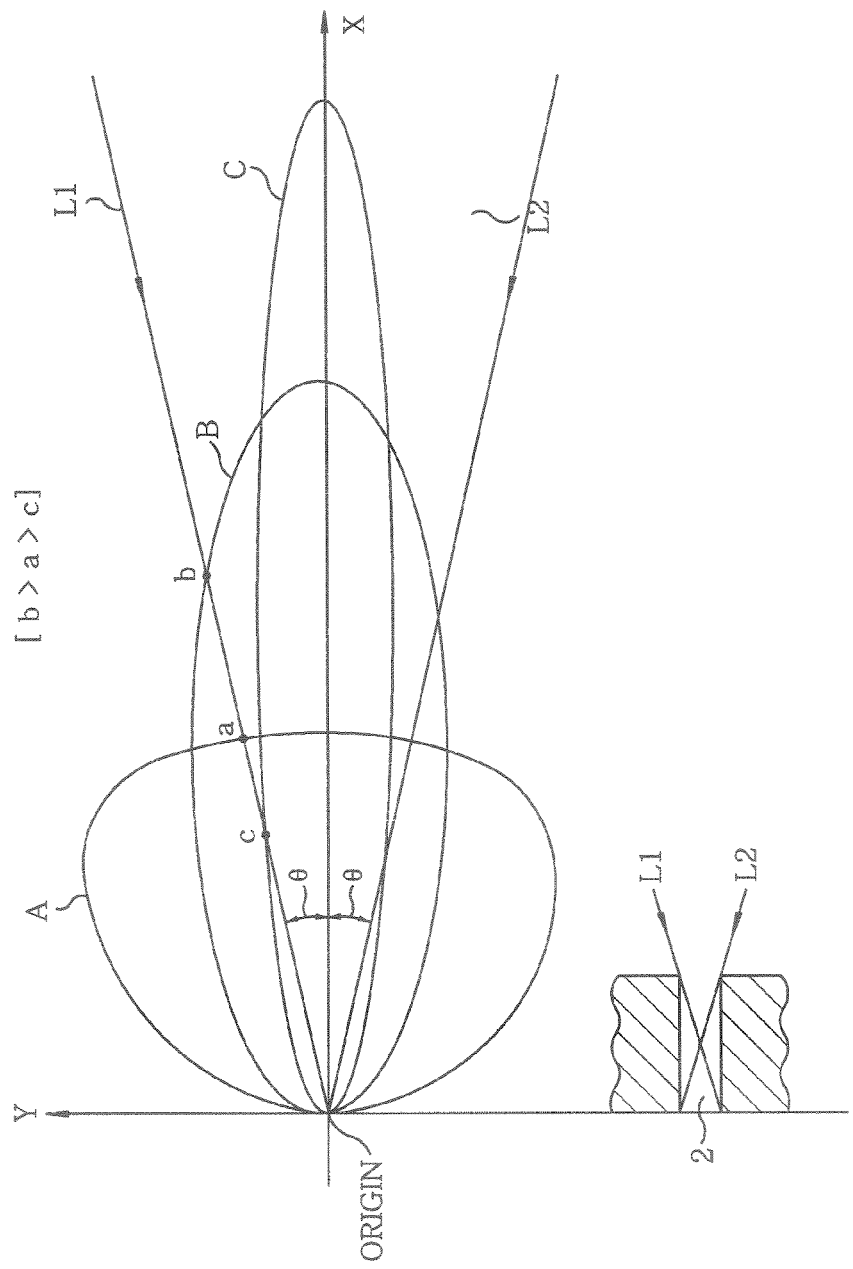

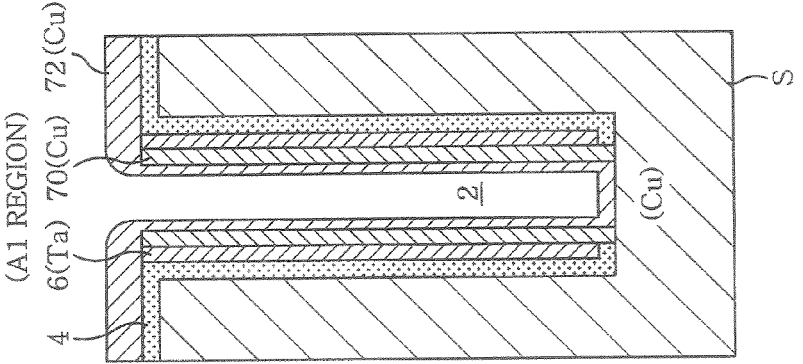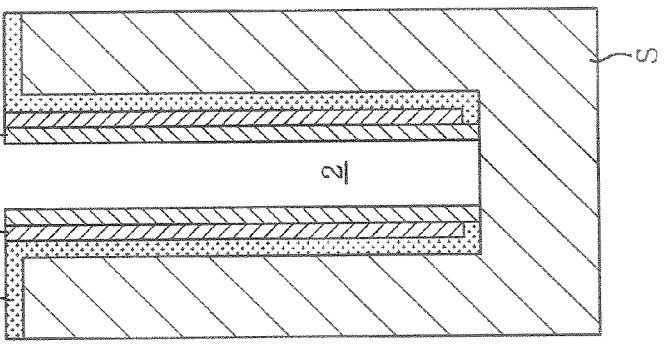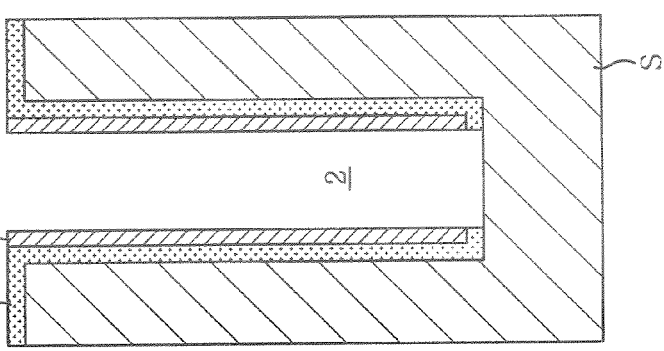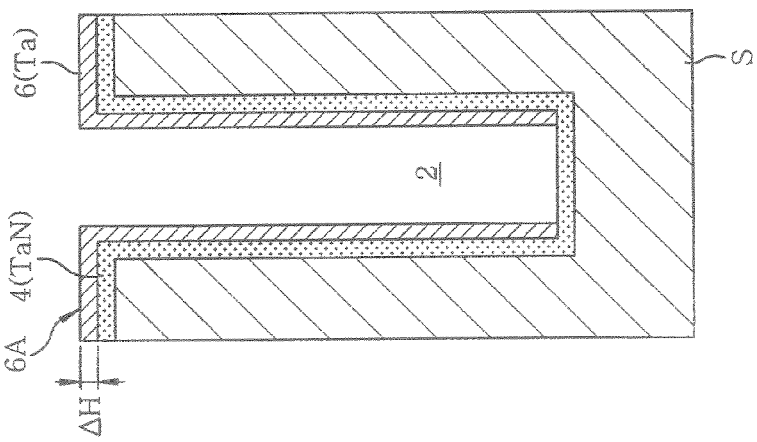

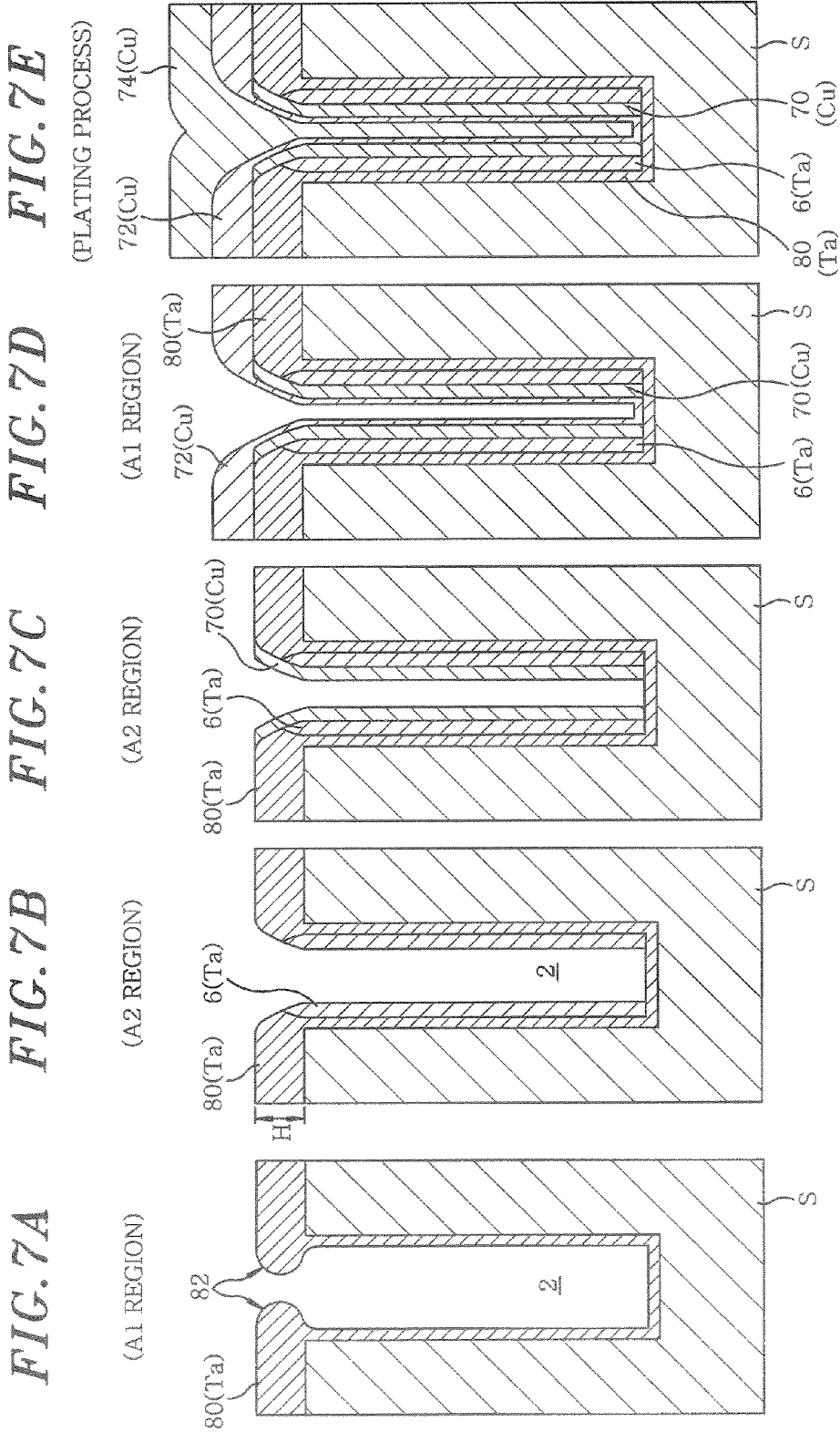

PLASMA SPUTTERING FILM DEPOSITION METHOD AND EQUIPMENT

FIELD OF THE INVENTION

The present invention relates to an improved film deposition method and equipment for depositing a thin metal film by using a plasma sputtering technique on a top surface of a target object, e.g., a semiconductor wafer or the like, and on a surface of a recess opened at the top surface.

BACKGROUND OF THE INVENTION

In general, a semiconductor device is manufactured by repeatedly performing on a semiconductor wafer various processes such as a film deposition process, a pattern etching process and the like. A demand for increasingly higher degree of integration and miniaturization of semiconductor devices leads to a further miniaturization of a line width or an opening diameter. Further, as for a wiring material or a material to be buried inexpensive Cu (copper) of a small electrical resistance tends to be used due to a miniaturization of various dimensions (see, Japanese Patent Laid-open Application No. 2000-77365). In case Cu is used for the wiring material or the material to be buried a barrier layer thereunder is generally formed of a tantalum metal film, a tantalum nitride film or the like by considering adhesivity and the like.

In order to form the barrier layer, a tantalum nitride film (hereinafter, referred to as "TaN film") is formed, as an underlying layer, on a wafer top surface and on a surface of a recess opened at the top surface in a plasma sputtering apparatus. Next, a tantalum film (hereinafter, referred to as "Ta film") is formed on the TaN film in the same plasma sputtering apparatus. Then, a thin seed film formed of a Cu film is formed on a surface of the barrier layer. Thereafter, a Cu plating process is performed on the entire wafer surface (the wafer top surface and the recess surface) thereby filling the recess.

FIG. 8 is a fragmentary vertical cross sectional view showing a peripheral portion of a recess of a semiconductor wafer S on which films have been deposited by employing a general plasma sputtering technique. A recess 2 opened at a top surface of the semiconductor wafer S corresponds to via hole, a through hole, a groove (a trench or a dual damascene structure) or the like. Due to a miniaturization of a design rule, the recess 2 has a considerably large aspect ratio (e.g., about 3 to about 4). For example, a width or an inner diameter of the recess 2 is about 0.01 µm.

Referring to FIG. 8, an underlying layer 4 formed of a TaN film is substantially uniformly formed on the entire surface of the wafer S (the top surface and the surface of the recess 2) in a plasma sputtering apparatus. Further, a metal film 6 formed of a Ta film is formed on the underlying layer 4 in the same plasma sputtering apparatus. When the underlying layer 4 or the metal film 6 is formed in the plasma sputtering apparatus, a high frequency bias power is applied to a mounting table for mounting thereon the wafer S to thereby attract metal ions. Next, a thin seed film formed of a Cu film is formed on an entire surface of the metal film 6 and, then, a Cu plating process is performed thereon, thus filling the recess 2 with the Cu film.

In general, when a film deposition is carried out in a plasma sputtering apparatus, a film deposition rate is increased high by attracting metal ions into a wafer surface by applying a bias power to a mounting table for mounting thereon a semiconductor wafer. However, if a bias power is excessively increased, the wafer surface is made to sputter by a discharge gas, e.g., Ar (argon) gas, introduced into the apparatus to generate a plasma, thereby removing deposited metal films, wherein the discharge gas is such gas that no deposition generate when the discharge gas is activated by plasma. To that end, the bias power is set to a level which is not too large.

In case the metal film formed of a Ta film has been deposited, the metal film 6 is likely to be formed in the recess 2 in a state shown in FIG. 8. In other words, the metal film 6 is adhered to a bottom portion of the recess 2 and to an upper portion of a sidewall of the recess 2 and, also, overhang portions 8 protruding toward an opening of the recess 2 are formed in the metal film 6. Further, bare portions 10 to which the metal film 6 is not deposited may be formed on a lower portion of the sidewall of the recess 2. This is because the metal ions generated by the sputtering have poor directionality and thus collide with the upper portion of the sidewall before they reach the lower portion of the sidewall in the condition that the bias power is not too large. As a consequence, the recess 2 is not completely filled with a Cu film even after a plating treatment or the like has been finished thereby developing a void.

SUMMARY OF THE INVENTION

It is therefore, an object of the present invention to provide a plasma sputtering film deposition method and equipment capable of uniformly depositing a metal film on a sidewall of a recess opened at a top surface of a target object.

From a study on a plasma sputtering film deposition method the present inventors have developed the present invention based on a conclusion that a metal film can be uniformly deposited even on a sidewall of a fine recess at a surface of a semiconductor wafer (top surface of target object) by controlling a bias power applied to a mounting table so that a metal film deposition based on a metal ion attraction and a sputter etching based on a plasma generated from a discharge gas are simultaneously performed.

In accordance with one aspect of the invention, there is provided a film deposition method including: a preparation process to mount a target object on a mounting table in a vacuum processing container, the target object having a top surface and a recess opened at the top surface; and a film deposition process to deposit a metal film on a sidewall of the recess by generating metal ions by way of making a metal target sputter with a plasma generated from a discharge gas in the processing container and by applying to the mounting table a bias power to cause a metal film deposition based on a metal ion attraction and a sputter etching based on the plasma generated from the discharge gas simultaneously on the top surface of the target object.

For example, the metal film is a tantalum film.

In this film deposition method the bias power in the film deposition process is preferably set to a level at which a rate of depositing the metal film by attracting the metal ions is substantially balanced with an etching rate of the sputter etching based on the plasma generated from the discharge gas.

In this film deposition method, there may be provided between the preparation process and the film deposition process, a process for depositing an underlying layer on the top surface of the target object and on a surface of the recess, the underlying layer being made of a material different from a material forming the metal film.

In this case, the bias power in the film deposition process is preferably set to a level at which the underlying layer is not sputter-etched.

Further, in this film deposition method, there may be provided, between the preparation process and the film deposition process, a process for depositing an initial metal film on the top surface of the target object and on the surface of the recess, the initial metal film being made of a metal same as a metal forming the metal film.

In this film deposition method, the film deposition process may include: a first subprocess for depositing a first metal film on the top surface of the target object and on the surface of the recess; and a second subprocess for depositing a second metal film on the first metal film, the second metal film being made of a metal different from a metal forming the first metal film.

Moreover, in this film deposition method, there may be provided, between the preparation process and the film deposition process, a process for depositing an underlying layer on the top surface of the target object and on the surface of the recess, the underlying layer being made of a material different from a material forming the metal film.

The film deposition process may further include, between the first subprocess and the second subprocess, a third subprocess for etching to remove the underlying layer deposited on a bottom portion of the recess.

Furthermore, when the second subprocess needs to be performed in a processing container different from that used in the first subprocess, a preparation process and the like can be carried out between the first and the second subprocess.

For example, the first and the second metal film are a tantalum film and a copper film, respectively.

For example, the underlying layer is a tantalum nitride film.

In accordance with another aspect of the invention, there is provided a film deposition equipment including a vacuum processing container; a mounting table provided in the processing container, for mounting thereon a target object having a top surface and a recess opened at the top surface; a gas supply system for supplying a processing gas containing a discharge gas into the processing container; a plasma generating system for generating a plasma from the discharge gas in the processing container; a metal target provided in the processing container and made to sputter by the plasma to generate metal ions; a bias power supply for applying a bias power to the mounting table; and a bias power supply controller for controlling the bias power so that the metal film is deposited on a sidewall of the recess by applying to the mounting table a bias power to cause a metal film deposition based on a metal ion attraction and a sputter etching based on the plasma generated from the discharge gas simultaneously on the top surface of the target object.

In this film deposition equipment, the bias power supply controller controls the bias power supply so that the bias power in the film deposition process is set to a level at which a rate of depositing the metal film by attracting the metal ions is substantially balanced with an etching rate of the sputter etching based on the plasma generated from the discharge gas.

In accordance with the aforementioned film deposition method and equipment, the metal film can be uniformly deposited on the sidewall of the recess opened at the top surface of the target object by controlling a bias power applied to a mounting table so that the metal film deposition based on the metal ion attraction and the sputter etching based on the plasma generated from the discharge gas are simultaneously performed at substantially same rates. As a result, by performing a plating process later, the recess opened at the top surface of the target object can be filled with a metal, e.g., Cu or the like, without developing a void.

BRIEF DESCRIPTION OF THE DRAWINGS

The above and other objects and features of the present invention will become apparent from the following description of embodiments, given in conjunction with the accompanying drawings, in which:

FIGS. 4A to 4E represent vertical cross sectional views of a peripheral portion of a recess of a semiconductor wafer, which respectively illustrate processes of a first embodiment of a method of the present invention;

FIG. 5 offers a graph showing a verticality of metal ions with respect to a bias power and a process pressure;

FIGS. 6A to 6D present vertical cross sectional views of a peripheral portion of a recess of a semiconductor wafer, which depict respective parts of processes of a second embodiment of the method of the present invention;

FIGS. 7A to 7F provide vertical cross sectional views of a peripheral portion of a recess of a semiconductor wafer, which describe respective processes of a third embodiment of the method of the present invention.

DETAILED DESCRIPTION OF THE EMBODIMENT

Hereinafter, a film deposition method and an embodiment of a film deposition equipment of the present invention will be described in detail with reference to the accompanying drawings.

Figure 1:
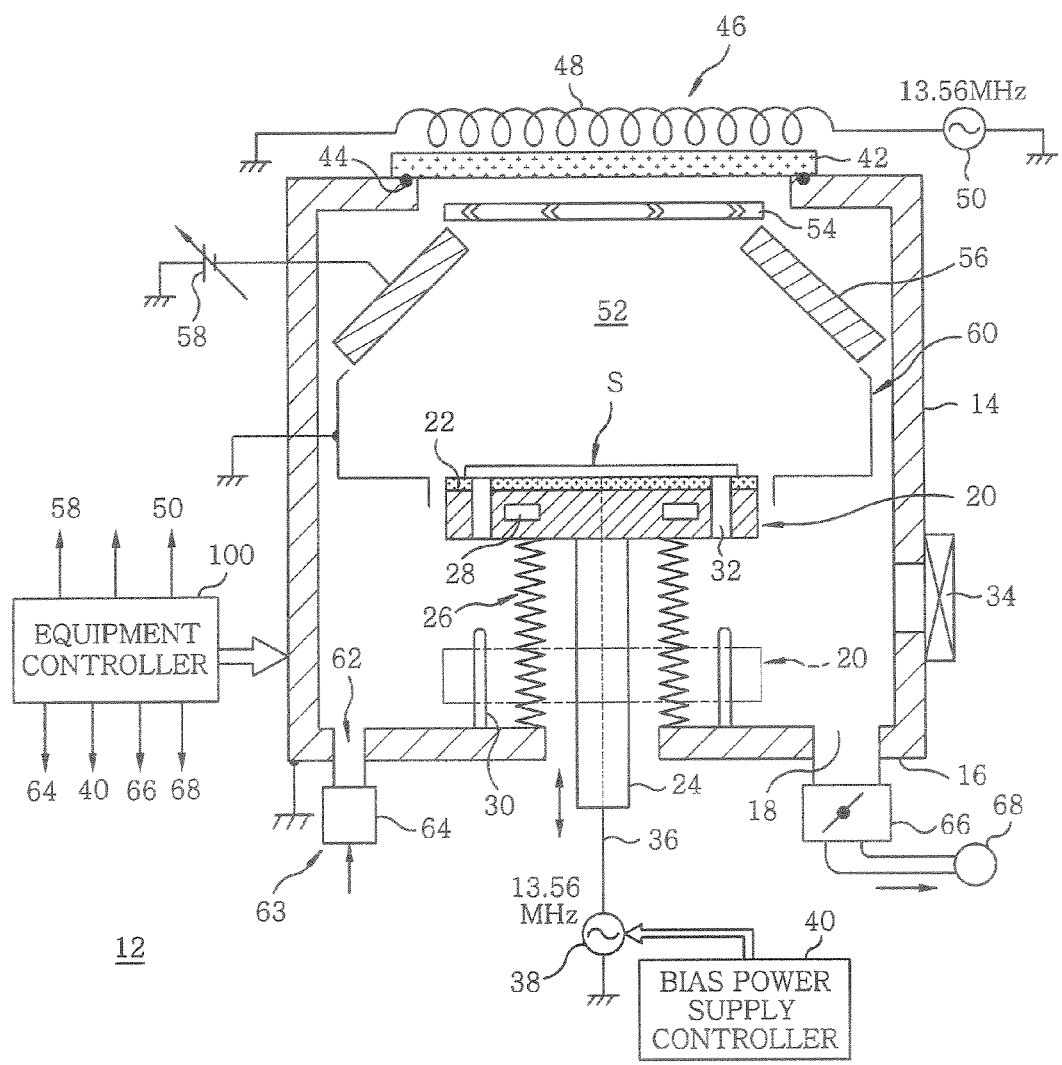
FIG. 1 shows a cross sectional view of an embodiment of a film deposition equipment of the present invention.

FIG. 1 is a cross sectional view of an example of a film deposition equipment of the present invention. Herein, an ICP (inductively coupled plasma) sputtering apparatus will be described as an example of the film deposition equipment. A film deposition equipment 12 has a hollow cylindrical vacuum processing container 14 made of e.g., aluminum. The processing container 14 is grounded and has on its bottom portion 16 a gas exhaust port 18. The gas exhaust port 18 is connected with a vacuum pump 68 via a throttle valve 66.

A circular plate shaped mounting table 20 made of, e.g. aluminum, is provided in the processing container 14. Installed on a top surface of the mounting table 20 is an electrostatic chuck 22 for attractively holding thereon a semiconductor wafer S as a target object. If necessary, a DC voltage for attraction (not shown) is applied to the electrostatic chuck 22. Further, the electrostatic chuck 22 is connected via a wiring 36 with a bias power supply 38 including a high frequency power supply for generating a high frequency wave of, e.g., 13.56 MHz. A bias power outputted from the bias power supply 38 is controlled by a bias power supply controller 40 including, e.g., a microcomputer.

The mounting table 20 is supported by a support 24 extending downward from a central portion of a bottom surface of the mounting table 20. The support 24 passes through a bottom portion 16 of the processing container 14 and is connected with an elevation mechanism (not shown). Accordingly, the support 24 can raise and lower the mounting table 20 in the processing container 4. An expansible/contractible metal bellows 26 is provided to surround the support 24. The metal bellows 26 has an upper end making an airtight contact with the bottom surface of the mounting table 20 and a lower end making an airtight contact with a top surface of the bottom portion 16. Formed in the mounting table 20 is a coolant path 28 where a coolant for cooling the wafer S circulates.

Further, a plurality of vertically raised supporting pins 30 are provided on the bottom portion 16 of the processing container. Formed in the mounting table 20 are pin insertion through holes 32 respectively corresponding to the supporting pins 30. Therefore, when the mounting table 20 is lowered, the wafer S is supported by upper ends of the supporting pins 30 passing through the pin insertion through holes 32 so that it can be transported to a transfer arm (not shown). Provided on a lower sidewall of the processing container 14 is a gate valve 34 that can be opened and closed to load or unload the transfer arm.

Moreover, a gas inlet port 62 for introducing a processing gas containing a discharge gas and Ar gas is provided on the bottom portion 16 of the processing container 14. In addition, there is provided a gas supply system 63 for supplying the processing gas into the processing container 14 via the gas inlet port 62. The gas supply system 63 includes a not shown gas supply source and a gas controller 64 including a gas flow rate controller, a valve and the like.

A transmitting plate 42 for allowing a high frequency wave to be transmitted therethrough is airtightly attached to a top of the processing container 14 via a seal member 44, the transmitting plate 42 being made of a dielectric material such as aluminum nitride or the like. Provided above the transmitting plate 42 is a plasma generating system 46 for generating a plasma from a discharge gas (Ar gas) in the processing space 52 in the processing container 14. The plasma generating system 46 includes an induction coil 48 disposed on the transmitting plate 42 and a high frequency power supply 50 of, e.g. 13.56 MHz, the high frequency power supply 50 being connected with the induction coil 48.

Disposed directly under the transmitting plate 42 is a baffle plate 54 made of, e.g., aluminum, for diffusing a high frequency wave transmitted from the induction coil 48 into the processing container 14 through the transmitting plate 42. An annular metal target 56 that becomes gradually getting narrower toward its top is arranged under the baffle plate 54 to surround an upper portion of the processing space 52. A variable DC power supply 58 is connected with the metal target 56. As for a material of the metal target 56, there is used, e.g., tantalum, copper or the like. The metal target 56 is made to sputter by a plasma generated from a discharge gas (Ar gas), thereby generating metal ions. To be specific, bombardments of Ar ions in the plasma make metal atoms or atom groups released from the metal target 56 and, then, the released metal atoms or atom groups are ionized while passing through the plasma, thus becoming metal ions.

A cylindrical protection cover 60 made of, e.g., aluminum, is provided under the metal target 56 to surround the processing space 52. The protection cover 60 is grounded and, also, a lower portion thereof is bent inward to be extended toward a vicinity of a side portion of the mounting table 20.

The film deposition equipment 12 includes an equipment controller 100 for controlling operation of each unit. To be specific the equipment controller 100 controls respective operations of the bias power supply controller 40, the high frequency power supply 50, the variable DC power supply 58, the gas controller 64, the throttle valve 66, the vacuum pump 68 and the like. As a consequence, following processes can be performed by the film deposition equipment 12.

First of all, the processing container 14 is exhausted to vacuum by operating the vacuum pump 68 and, then, a gas is made to flow into the processing container 14 under the control of the gas controller 64. Next, an inside of the processing container 14 is maintained at a specific vacuum level by controlling the throttle valve 66. Thereafter, a DC power is applied from the variable DC power supply 58 to the metal target 56 and, also, a high frequency power is applied. From the high frequency power supply 50 to the induction coil 48. Further, a specific bias power is applied from the bias power supply 38 under the control of the bias power supply controller 40 to the mounting table 20.

Accordingly, Ar gas is converted into a plasma in the processing space 52 by the powers applied to the metal target 56 and the induction coil 48. Next, Ar ions in the plasma collide with the metal target 56 thereby making the metal target 56 sputtered. Metal atoms or atom groups released from the metal target 56 in the sputtering are ionized while passing through the plasma and become metal ions. The metal ions are attracted by the bias power applied to the mounting table 20 and then deposited on a surface of the wafer S.

As will be described later, Ar ions in the plasma can also be attracted toward the mounting table 20 by increasing the bias power applied to the mounting table 20 under the control of the bias power supply controller 40 controlled by the equipment controller 100.

Moreover, the control by the equipment controller 100 is performed based on a control program developed in advance. The control program can be read from various storage mediums such as a magnetic storage medium, an optical storage medium, a semiconductor memory and the like.

Hereinafter, a principle of the method of the present invention which is executed by using the film deposition equipment configured as described above will be explained with reference to FIGS. 2 and 3.

To begin with, the present invention is characterized in that when a metal film is deposited by employing a plasma sputtering technique, the metal film is made to be mainly deposited on a sidewall of a recess by controlling a bias power applied to a mounting table so that a metal film deposition based on a metal ion attraction and a sputter etching based on a plasma (Ar ions) generated from a discharge gas are simultaneously performed on a top surface of a wafer where the recess is formed. To be specific, the bias power is controlled to be maintained at a level at which a rate of depositing the metal film by attracting metal ions is substantially balanced with an etching rate of the sputter etching based on the plasma generated from the discharge gas.

Figure 2:
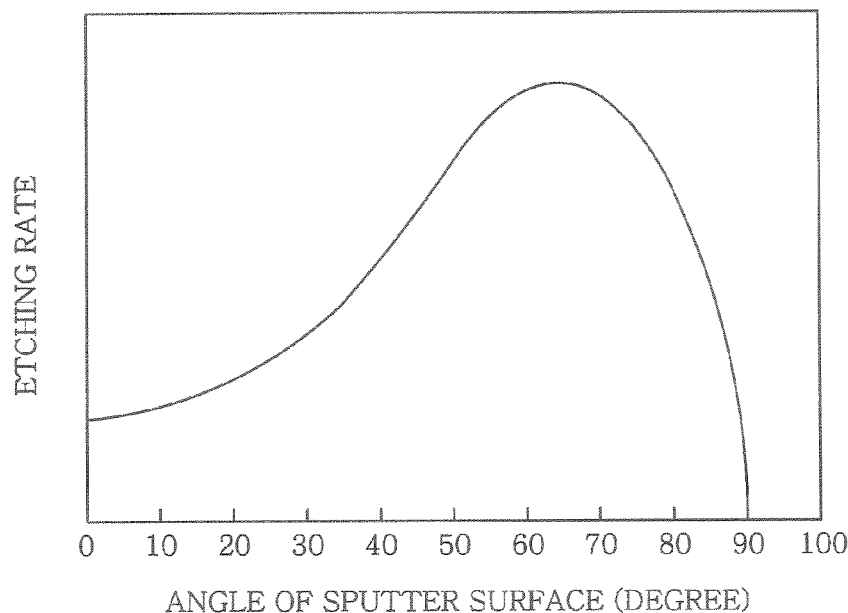
FIG. 2 describes a graph illustrating angle dependency of a sputter etching.

This will be described in detail hereinafter. First of all, etching rate characteristics of the sputter etching based on the plasma generated from the discharge gas are checked without considering a film deposition amount. FIG. 2 provides a graph illustrating a relationship between an angle of a sputter surface and an etching rate. Herein, the angle of the sputter surface is defined as an angle formed by a normal line of the sputter surface and an incident direction of Ar ion. For example, when the sputter surface is a top surface of a wafer or a bottom portion of a recess, the angle of the sputter surface is 0°. Further, when the sputter surface is a sidewall of the recess, the angle of the sputter surface is 90°. As clearly can be seen from the graph, the sputter etching is performed to a certain degree on the sputter surface having an angle of 90° (wafer top surface), whereas the sputter etching is hardly performed on the sputter surface having an angle of 90°

(recess sidewall). Moreover, the sputter etching is excessively performed on the sputter surface having an angle ranging from about 40° to about 80° (vicinity of recess opening).

Figure 3:
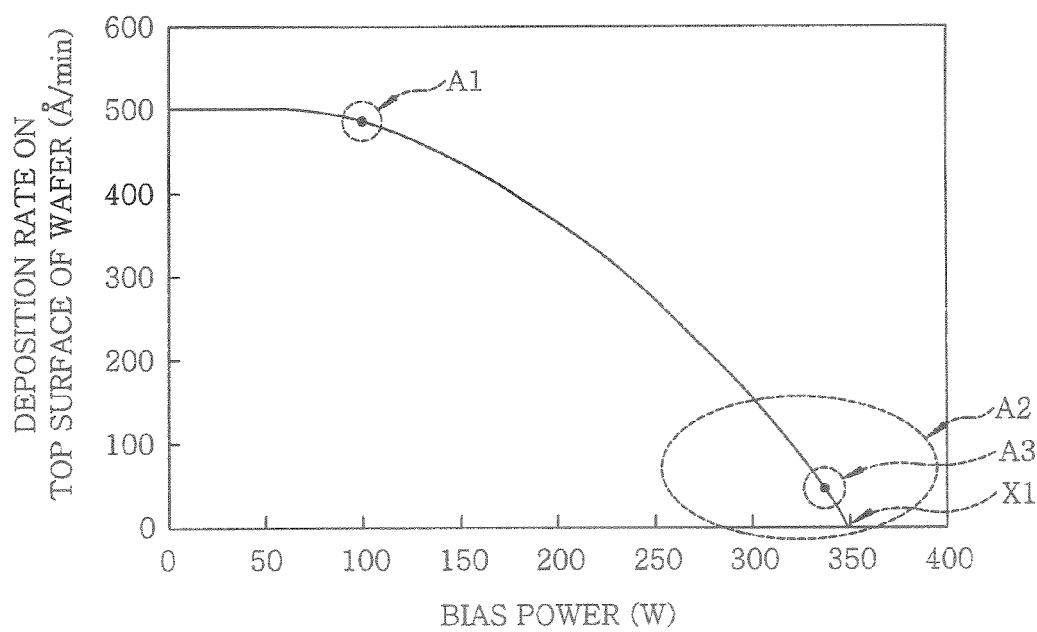
FIG. 3 provides a graph depicting a relationship between a bias power and a film deposition rate on a top surface of a wafer.

FIG. 3 shows a relationship between a bias power applied to the wafer S and a metal film deposition rate on the top surface of the wafer S (not including the sidewall of the recess) under the condition that the high frequency power for plasma generation is assumed to be constant in a film deposition equipment including the ICP sputtering device shown in FIG. 1. To be specific, when the bias power is set to a low level, the film deposition amount can be maintained to a high level by attracting metal ions. However, as the bias power increases, ions in the plasma generated from the discharge gas are accelerated by the bias power thus increasing the sputter etching rate on the wafer top surface (see, FIG. 2). As a result the metal films that have been deposited are removed by the etching.

Therefore, when the rate of depositing a film by attracting metal ions is balanced with the etching rate of the sputter etching based on the plasma generated from the discharge gas on the wafer top surface, the film deposition and the etching are counterbalanced by each other and, hence an actual film deposition amount on the wafer top surface becomes zero. A condition involved herein corresponds to a point X1 (bias power of 350 W) of FIG. 3. Further, the bias power and the film deposition rate shown in FIG. 3 are only examples and can be varied depending on devices, film deposition time and the like.

A conventional condition used in the sputtering device corresponds to a region A1 of FIG. 3. The region A1 ensures a high film deposition amount (film deposition rate) without excessively increasing the bias power. Meanwhile, in the method of the present invention, a film is deposited under a condition corresponding to a region A2 where a rate of depositing a film by attracting metal ions is substantially the same as an etching rate of the sputter etching based on the plasma generated from the discharge gas on the wafer top surface. The concept of being "substantially the same" is applied to a case where the film deposition amount corresponds to about 3/10 of that in the region A1 as well as a case where the actual film deposition amount on the wafer top surface is zero.

Hereinafter, the method of the present invention will be described in detail with reference to a first to a third embodiment.

First Embodiment

Figure 8:
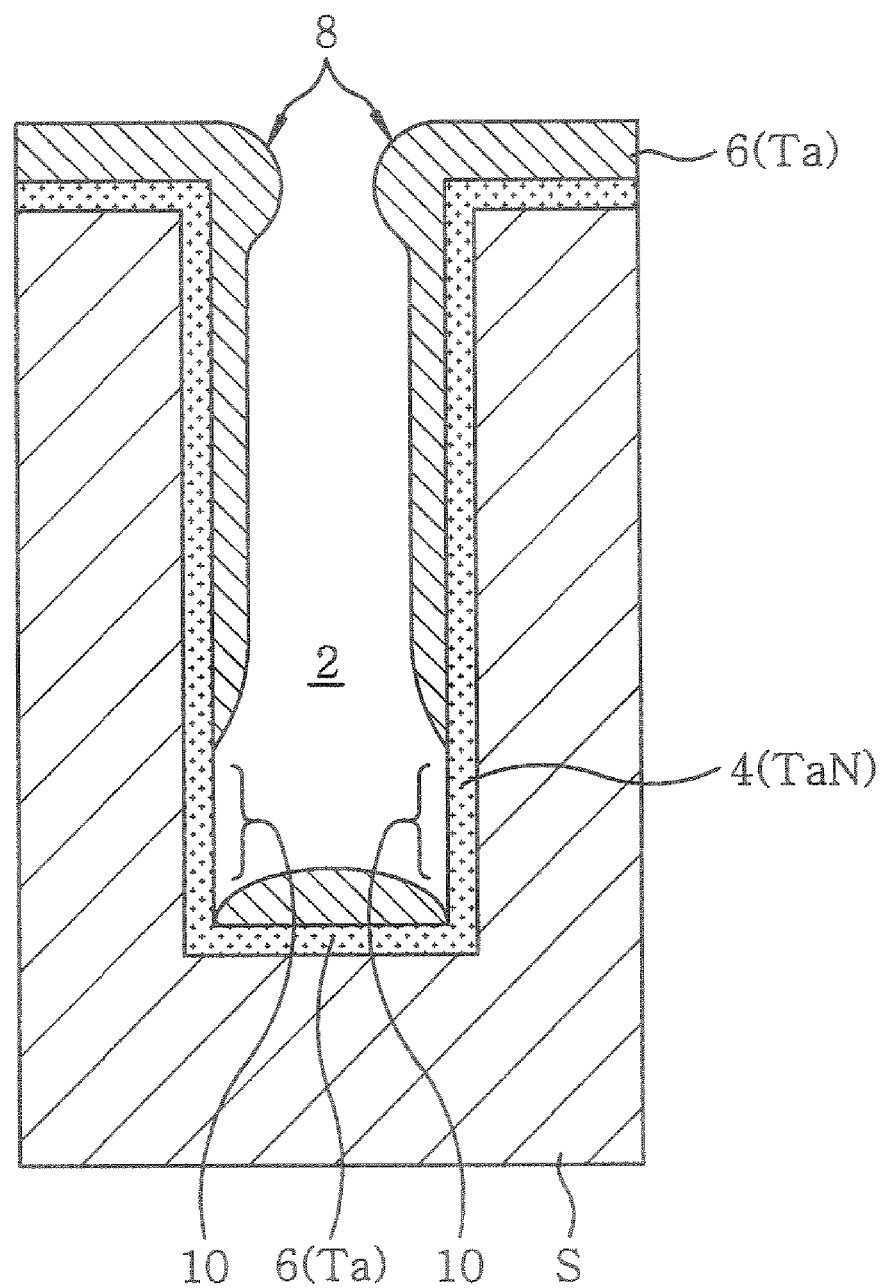
FIG. 8 is a vertical cross sectional view showing a peripheral portion of a recess of a semiconductor wafer on which films have been deposited by using a general plasma sputtering technique.

Referring to FIG. 1, above all in a state where the mounting table 20 is lowered, the wafer S is loaded into the processing container 14 via the gate valve 34 and then supported on the support pins 30. Next, the mounting table 20 is raised so that the wafer S can be mounted on a top surface of the mounting table 20 and attractively held by the electrostatic chuck 22 (preparation process). The wafer S has at its top surface the recess 2 e.g., a via hole, a through hole or a groove, which has been formed in advance to be opened, as described earlier with reference to FIG. 8.

After an inside of the processing container 14 is evacuated to a specific pressure level, a high frequency power is applied to the induction coil 48 of the plasma generating system 46 and, also, a specific bias power is applied from the bias power supply 38 to the electrostatic chuck 22 of the mounting table 20, to thereby carry out a film deposition. In this example, in order to form a TaN film, the metal target 56 is made of Ta (tantalum) and, also, a processing gas containing Ar gas as a discharge gas and $N_2$ gas as a nitriding gas are supplied into the processing container 14. Accordingly, as shown in FIG. 4A, the TaN film is substantially uniformly formed, as the underlying layer 4, on an entire surface of the wafer S (the top surface and the surface of the recess 2). At this time, the bias power is equal to that applied under the conventional film deposition condition corresponding to the region A1 of FIG. 3. Specifically, the bias power is about 100 W. In this case, since the underlying layer 4 formed of the TaN film is very thin, there is no overhang formed in the opening of the recess 2.

Thereafter, a film deposition process as a feature of the present invention is carried out. In the film deposition process, the bias power applied to the mounting table 20 is increased to a level corresponding to the region A2 shown in FIG. 3. For example a Ta film serving as a first metal film is deposited while setting the bias power to a level corresponding to the point X1 of FIG. 3, i.e., about 350 W, so that the film deposition amount on the wafer top surface becomes zero (first subprocess). At this time, the supply of the nitriding gas from the gas inlet port 62 is stopped and Ar gas is exclusively supplied as the processing gas. Accordingly, as shown in FIG. 4B a first metal film 6 formed of a Ta film is substantially uniformly deposited on the sidewall of the recess 2 and hardly deposited on the top surface of the wafer S or on the bottom portion of the recess 2. Further, there is no overhang formed in the opening of the recess 2.

The reason therefor will be described as follows. By setting the bias power to a level corresponding to the region A2 of FIG. 3, especially to the point X1, a rate of depositing a film by attracting metal ions becomes substantially balanced with an etching rate of the sputter etching based on the plasma generated from the discharge gas on the wafer top surface normal to a direction of attracting the metal ions. Thus, the metal film deposition amount on the wafer top surface becomes substantially zero. Further, the metals scattered from the bottom portion of the recess 2 by the sputtering are deposited on the sidewall of the recess 2, so that the film deposition amount on the bottom portion of the recess 2 becomes substantially zero. Since the metals released from the bottom portion of the recess 2 are deposited on the sidewall the film thickness uniformity on the sidewall is improved. The nonoccurrence of the overhang 8 (see, FIG. 8) in the opening of the recess 2 also results from the counterbalance between the film deposition and the etching.

It should be noted that, in the film deposition method in which a rate of depositing a film by attracting metal ions is substantially balanced with an etching rate of the sputter etching based on the plasma generated from the discharge gas a metal for use in the film deposition does not contain neutral metal atoms in the plasma and, also, substantially all of them (95% or more, preferably 99% or more) are ionized. To do so, it is preferable to increase the high frequency power of the plasma generating system 46 (about 5000 W to 6000 W).

In case film deposition species contain neutral metal atoms, the etching on the bottom portion of the recess 2 exceeds the film deposition thereon even when the film deposition amount on the wafer top surface is zero. Accordingly, the barrier layer 4 serving as an underlying layer is damaged, which is not desirable. Although the neutral metal atoms are deposited on the wafer top surface, they do not reach the bottom portion of the recess 2 due to a low verticality to the wafer S. Therefore, the number of plasma ions of the discharge gas exceeds the number of the metal ions on the bottom portion of the recess 2, which enhances the etching.

Herein, it is assumed for simplicity that a single metal atom (or metal ion) is released (etched) by a collision with a single ion in the plasma generated from the discharge gas. Since the metal film is deposited on the sidewall of the recess 2 in the film deposition method of the present invention, it is preferable that the metal ions have a low verticality to the wafer. To do so, a mean free path of the metal ions is shortened by maintaining a pressure in the processing container 14 at a higher level compared with the conventional film deposition method i.e., at a low vacuum state (about 1 mTorr to about 100 mTorr, more preferably, about 3 mTorr to 10 mTorr). Accordingly, a frequency of the collision between the metal ions and the plasma generated from the discharge gas increases and, also, the verticality of the metal ions to the wafer decreases.

This will be described with reference to FIG. 5 FIG. 5 is a graph depicting a verticality of metal ions with respect to a bias power and a process pressure. Ellipses A to C shown in FIG. 5 provide the amount of metal ions deposited on a unit area of the wafer top surface and an incident angle thereof. To be specific, when a straight line is drawn from the origin to cross each of the ellipses, a distance from the origin to an intersection point indicates the amount of metal ions, and an angle formed by the straight line and the X-axis represents the incident angle. Herein, the incident angle of 0° is obtained when the metal ion is vertically incident on the wafer top surface. For example, the ellipse A corresponds to a case of performing a film deposition under the condition of the region A1 of FIG. 3; the ellipse B corresponds to a case of performing a film deposition under a low vacuum pressure and the condition of the point X1 of FIG. 3; and the ellipse C corresponds to a case of performing a film deposition under a high vacuum pressure (0.5 mTorr or less) and the condition of the point X1. Besides, as can be seen from a lower part of FIG. 5, straight lines L1 and L2 represent a critical angle θ of the metal ions that can reach the bottom portion of the recess 2.

The metal ions that are incident on the wafer top surface at an angle smaller than the critical angle θ of FIG. 5 are deposited on the bottom portion of the recess 2 as well as on the sidewall of the recess. Meanwhile, the metal ions that are incident at an angle higher than the critical angle θ are deposited only on the sidewall. As the angle increases, the metal ions tend to be deposited on an upper portion of the recess 2. Therefore, in order to uniformly deposit a film on the entire sidewall of the recess 2 as in the present invention it is preferable to apply conditions of the ellipse A having more components in the vicinity of the critical angle θ than the ellipse C, and, is more preferable to use conditions of the ellipse B.

Further, by setting the bias power within the region A2 except the point X1, the first metal film 6 can be deposited on the wafer top surface with a much thinner thickness compared with that obtained in the region A1. Furthermore, the bias power is within the range where the underlying layer 4 formed of a TaN film is not damaged (etched) by the sputtering.

By depositing the first metal film 6 formed of a Ta film in the first subprocess as described above, the barrier layer having a laminated structure including a TaN film and a Ta film is formed as shown in FIG. 4B. Thereafter a second subprocess is carried out. In the second subprocess, the wafer S is transported on a mounting table 20 of a second film deposition equipment having a configuration same as that of the first film deposition equipment 12 of FIG. 1 except for changing a material of the metal target 56 from a Ta to a Cu Next, as can be seen from FIG. 4C, a metal film 70 formed of a Cu film is deposited, as a second metal film different from the first metal film 6 formed of a Ta film, on the first metal film 6 deposited on the sidewall of the recess 2 under a plasma power condition (the point X1 of FIG. 3) same as that of the first subprocess. In this case as well, the metal film 70 is uniformly deposited on the sidewall of the recess 2.

At this time, the semiconductor wafer S can be transferred to the second film deposition equipment without being exposed to the atmosphere by connecting a processing container of the second film deposition equipment with the processing container 14 of the first film deposition equipment via a vacuum evacuable transfer chamber.

Then, by setting the plasma power within the region A1 of FIG. 3 in the second film deposition equipment, a Cu film 72, an electrode for plating is deposited on the entire surface of the wafer S (the top surface and the surface of the recess 2), as shown in FIG. 4D. The formation of an overhang portion in the opening of the recess 2 can be prevented by reducing a thickness of the Cu film 72 to, e.g., about 90 nm or below.

Thereafter, the wafer S is unloaded from the second film deposition equipment and then subjected to a conventional plating treatment. Accordingly, the recess 2 is completely filled with a Cu 74, as shown in FIG. 4E. An this case, since there is no overhang portion formed in the opening of the recess 2 unlike in the conventional method shown in FIG. 8, a void or the like is not generated and, hence, the recess 2 can be completely filled with the Cu 74. The film deposition process using the plasma sputtering technique controlled by the equipment controller 100 of FIG. 1 is performed under following processing conditions: an output of the DC power supply 58 for the target object of about 0 W to about 12000 W; a flow rate of Ar gas of about 50 sccm to about 1000 sccm; a bias power of about 320 W to about 350 W; and a flow rate of $N_2$ gas of about 5 sccm to about 500 sccm.

Second Embodiment

Hereinafter, a second embodiment of the method of the present invention will be described with reference to FIGS. 6A to 6D.

This embodiment further includes a third subprocess (FIG. 6B) for etching the underlying layer 4 formed on the bottom portion of the recess 2 between the first subprocess (FIG. 6A) and the second subprocess (FIG. 6C).

The following is a description of a difference between a first subprocess of this embodiment and that (FIG. 4B) of the first embodiment. In order to avoid damages from an etching in a next process, as shown in FIG. 6A, a metal film 6A having a slight thickness ΔH is deposited on the top surface of the wafer S by applying a bias power (e.g., about 320 W) corresponding to a region A3 (slightly upper than the point X1) in the region A2 of FIG. 3. At this time, a metal film (not shown) is deposited on the bottom portion of the recess 2 with a thickness of 20% of the thickness ΔH of the metal film 6A deposited on the top surface of the wafer S.

Next, the third subprocess is performed to exclusively etch the underlying layer 4 deposited on the bottom portion of the recess 2, as can be seen from FIG. 6B. The third subprocess is carried out, as a sputter etching based on a plasma generated from Ar gas, by using an equipment in which the metal target 56 is removed from the film deposition equipment 12 of FIG. 1. At this time, although the sputter etching is performed on the top surface of the wafer S, the top surface of the wafer S is not damaged due to the presence of the thin metal film 6A that has been previously formed as a protective film.

Thereafter, the second subprocess is performed to deposit the second metal film 70 formed of a Cu film, as shown in FIG. 6C. After the Cu film 72 is deposited as shown in FIG. 6D, the recess 2 is filled with the Cu 74 by the plating process (FIG. 4E) as in the first embodiment. In general, there exists a wiring formed of Cu and the like under the recess 2, therefore a Cu—Cu contact is obtained in this embodiment in which the TaN film 4 is not deposited on the bottom portion of the recess 2. Moreover, an electrical resistance on that portion can be greatly reduced.

Third Embodiment

Hereinafter, a third embodiment of the method of the present invention will be described with reference to FIGS. 7A to 7E.

Instead of the process for depositing the underlying layer 4 formed of a TaN film (FIG. 4A) in the first embodiment, this embodiment includes a process for depositing, as a stopper layer, an initial metal film 80 (FIG. 7A) formed of a Ta film same as that forming the first metal film 6.

To be specific, as can be seen from FIG. 7A, the initial metal film 80 formed of a Ta film is deposited on the entire surface of the wafer S (the top surface and the surface of the recess 2) by employing the plasma sputtering technique as in the prior arts. At this time, the initial metal film 80 is deposited with a sufficient thickness (e.g. 100 nm or more) by using a bias power corresponding to the region A1 of FIG. 3. In this case, the Ta film is deposited on the sidewall as well as on the bottom portion of the recess 2 and, also, overhang portions 82 are formed at the opening of the recess 2. However, the overhang portions 82 can be removed by a following process.

Next, a first subprocess is performed to deposit the first metal film 6 formed of a Ta film, as shown in FIG. 7B. At this time, a bias power is set to a level corresponding to the point X1 of FIG. 3, as in the first subprocess of the first embodiment (FIG. 4B). Accordingly, the first metal film 6 is deposited only on the sidewall of the recess 2. Since the film deposition based on the metal ion attraction and the sputter etching based on the plasma (Ar ions) generated from the discharge gas are simultaneously performed on the top surface of the wafer S at substantially same rates, the thickness H of the initial metal film 80 on the top surface of the wafer S hardly changes. Further, since the parts near to the opening of the recess 2 can be heavily bombarded by Ar ions from every direction to thereby be easily made to sputter, the overhang portions 82 (FIG. 7A) are removed, which results in a relatively good opening shape.

Then, a second subprocess is carried out to deposit the second metal film 70 formed of a Cu film, as can be seen from FIG. 7C. After the Cu film 72 is deposited as shown in FIG. 7D, the recess 2 is filled with the Cu 74 by a plating treatment shown in FIG. 7E. In this case as well, the effects of the first embodiment can be obtained. In other words, it is possible to avoid a development of a void or the like in the recess 2, for example.

The values in the above-described embodiments are only examples and thus can be varied. Moreover, although the laminated structure of TaN/Ta/Cu (the first and the second embodiment) or Ta/Cu (the third embodiment) is described as the laminated structure of the barrier film/the seed film in the above-described embodiments, the present invention is not limited thereto and can also be applied to a laminated structure of TiN/Ti/Cu, TiN/Ti/Ru, Ti/Cu or Ti/Ru.

Besides, the frequency of each high frequency power supply is not limited to 13.56 MHz and can be varied. For example, there can be employed a frequency of 27.0 MHz. In addition, the discharge gas is not limited to Ar gas and can also be a nonreactive gas such as He gas, Ne gas or the like. Moreover, although a semiconductor wafer is used as a target object in the above-described embodiments, the present invention can also be applied to an LCD substrate, a glass substrate or the like.

While the invention has been shown and described with respect to the embodiments, it will be understood by those skilled in the art that various changes and modification may be made without departing from the scope of the invention as defined in the following claims.

What is claimed is:

1. A film deposition method comprising:

mounting, using a preparation process, a target object on a mounting table in a vacuum processing container, the target object having a top surface and a recess opened at the top surface; and depositing, using a film deposition process, a metal film on a sidewall of the recess by generating metal ions by making a metal target sputter with a plasma generated from a discharge gas in the processing container and by applying, to the mounting table, a bias power to cause a metal film deposition based on a metal ion attraction and a sputter etching based on the plasma generated from the discharge gas simultaneously on the top surface of the target object, wherein the bias power in the film deposition process is set to a level at which a rate of depositing the metal film by attracting the metal ions is substantially balanced with an etching rate of the sputter etching based on the plasma generated from the discharge to cause a film deposition amount on the top surface of the target object to become substantially zero.

2. The film deposition method of claim 1, further comprising, between the preparation process and the film deposition process, a process for depositing an underlying layer on the top surface of the target object and on a surface of the recess, the underlying layer being formed of a material different from a material forming the metal film.

3. The film deposition method of claim 2, wherein the bias power in the film deposition process is set to a level at which the underlying layer is not sputter-etched.

4. The film deposition method of claim 1, further comprising, between the preparation process and the film deposition process, a process for depositing an initial metal film on the top surface of the target object and on the surface of the recess, the initial metal film being made of a metal same as a metal forming the metal film.

5. The film deposition method of claim 1, wherein the film deposition process includes:

depositing a first metal film on on the surface of the recess; and depositing a second metal film on the first metal film, the second metal film being made of a metal different from a metal forming the first metal film.

6. The film deposition method of claim 1, wherein the metal film is a tantalum film.

7. The film deposition method of claim 5, wherein the first and the second metal film are a tantalum film and a copper film, respectively.

8. A film deposition equipment comprising:

a vacuum processing container;

a mounting table provided in the processing container to mount thereon a target object having a top surface and a recess opened at the top surface;

a gas supply system to supply a processing gas containing a discharge gas into the processing container;

a plasma generating system to generate a plasma from the discharge gas in the processing container;

a metal target provided in the processing container and made to sputter by the plasma to generate metal ions;

a bias power supply to apply a bias power to the mounting table; and a bias power supply controller to control the bias power so that the metal film is deposited on a sidewall of the recess by applying to the mounting table a bias power to cause a metal film deposition based on a metal ion attraction and a sputter etching based on the plasma generated from the discharge gas simultaneously on the top surface of the target object, wherein the bias power supply controller controls the bias power supply so that the bias power in the film deposition process is set to a level at which a rate of depositing the metal film by attracting the metal ions is substantially balanced with an etching rate of the sputter etching based on the plasma generated from the discharge gas to cause a film deposition amount on the top surface of the target object to become substantially zero.

9. The film deposition method according to claim 1, wherein depositing the metal film on the sidewall of the recess further includes adjusting a pressure in the vacuum processing container to shorten a mean free path of the metal ions.

10. The film deposition equipment according to claim 8, wherein a pressure of the vacuum processing container is adjusted to shorten a mean free path of the metal ions.

* * * * *